United States Patent
Ota et al.

(10) Patent No.: US 9,746,017 B2
(45) Date of Patent: Aug. 29, 2017

(54) FASTENER INCLUDING A WIRELESS MODULE AND A WIRELESS DEVICE ATTACHABLE TO THE SAME

(71) Applicant: KABUSHIKI KAISHA TOSHIBA, Tokyo (JP)

(72) Inventors: Hiroshi Ota, Misato Saitama (JP); Daigo Suzuki, Kawasaki Kanagawa (JP); Yasuhiro Fukuju, Yokohama Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/062,005

(22) Filed: Mar. 4, 2016

(65) Prior Publication Data

US 2017/0082132 A1    Mar. 23, 2017

Related U.S. Application Data

(60) Provisional application No. 62/221,838, filed on Sep. 22, 2015.

(51) Int. Cl.
| | |
|---|---|
| *G08B 1/08* | (2006.01) |
| *F16B 35/00* | (2006.01) |
| *G01P 15/18* | (2013.01) |
| *G08B 5/00* | (2006.01) |
| *G01R 33/02* | (2006.01) |
| *G01C 19/56* | (2012.01) |
| *G08B 25/10* | (2006.01) |

(52) U.S. Cl.
CPC .............. *F16B 35/00* (2013.01); *G01C 19/56* (2013.01); *G01P 15/18* (2013.01); *G01R 33/0206* (2013.01); *G08B 5/00* (2013.01); *G08B 25/10* (2013.01)

(58) Field of Classification Search
CPC ........ F16B 35/00; F16B 35/06; F16B 41/005; F16B 41/007; F16B 31/025
USPC ...... 340/539.1, 665, 671, 672, 686.1, 686.3; 73/760, 761
See application file for complete search history.

(56) References Cited

U.S. PATENT DOCUMENTS

| | | | |
|---|---|---|---|
| 6,354,152 B1 * | 3/2002 | Herlik ................. | G01N 29/223 73/597 |
| 7,246,980 B2 * | 7/2007 | Azzalin ................ | F16B 41/005 292/327 |
| 8,439,404 B2 * | 5/2013 | Anton .................. | F16J 15/064 285/382.7 |
| 8,683,869 B2 * | 4/2014 | Herley .................. | F16B 31/02 73/760 |
| 2014/0207329 A1 | 7/2014 | Juzswik | |

(Continued)

FOREIGN PATENT DOCUMENTS

| | | |
|---|---|---|
| JP | 2009-097707 | 5/2009 |
| JP | 2010-185809 | 8/2010 |
| JP | 2011-241567 | 12/2011 |

*Primary Examiner* — Toan N Pham
(74) *Attorney, Agent, or Firm* — Patterson & Sheridan, LLP

(57) ABSTRACT

A fastener having threads includes a main body including a head portion and a thread portion having the threads, a sensor mounted on the main body and configured to detect orientation of the fastener, and a wireless module mounted on the main body and configured to transmit data indicating the detected orientation through a wireless signal.

20 Claims, 8 Drawing Sheets

(56) References Cited

U.S. PATENT DOCUMENTS

2015/0336527 A1* 11/2015 Ghannam ........... G01L 19/0069
73/723
2016/0153443 A1* 6/2016 Glass ...................... G01L 23/10
417/53

* cited by examiner

FASTENER INCLUDING A WIRELESS MODULE AND A WIRELESS DEVICE ATTACHABLE TO THE SAME

CROSS-REFERENCE TO RELATED APPLICATION

This application is based upon and claims the benefit of priority from U.S. Provisional Patent Application No. 62/221,838, filed on Sep. 22, 2015, the entire contents of which are incorporated herein by reference.

FIELD

Embodiments described herein relate generally to a fastener, in particular, a fastener including a wireless module.

BACKGROUND

An apparatus for measuring axial force on a bolt, using a strain gauge set inside the bolt is known.

DETAILED DESCRIPTION

According to an embodiment, a fastener having threads includes a main body including a head portion and a thread portion having the threads, a sensor mounted on the main body and configured to detect orientation of the fastener, and a wireless module mounted on the main body and configured to transmit data indicating the detected orientation through a wireless signal.

Embodiments of a fastener including and a detection system are described below with reference to the drawings. In the description below, elements having the same or similar functions are described with the same reference symbol, and duplicate descriptions thereof might be omitted.

First Embodiment

A fastener including a wireless device (module) 1 and a detection system (center) 2 according to a first embodiment are described with reference to FIG. 1 through FIG. 6.

[1. Wireless Device]

Figure 1:
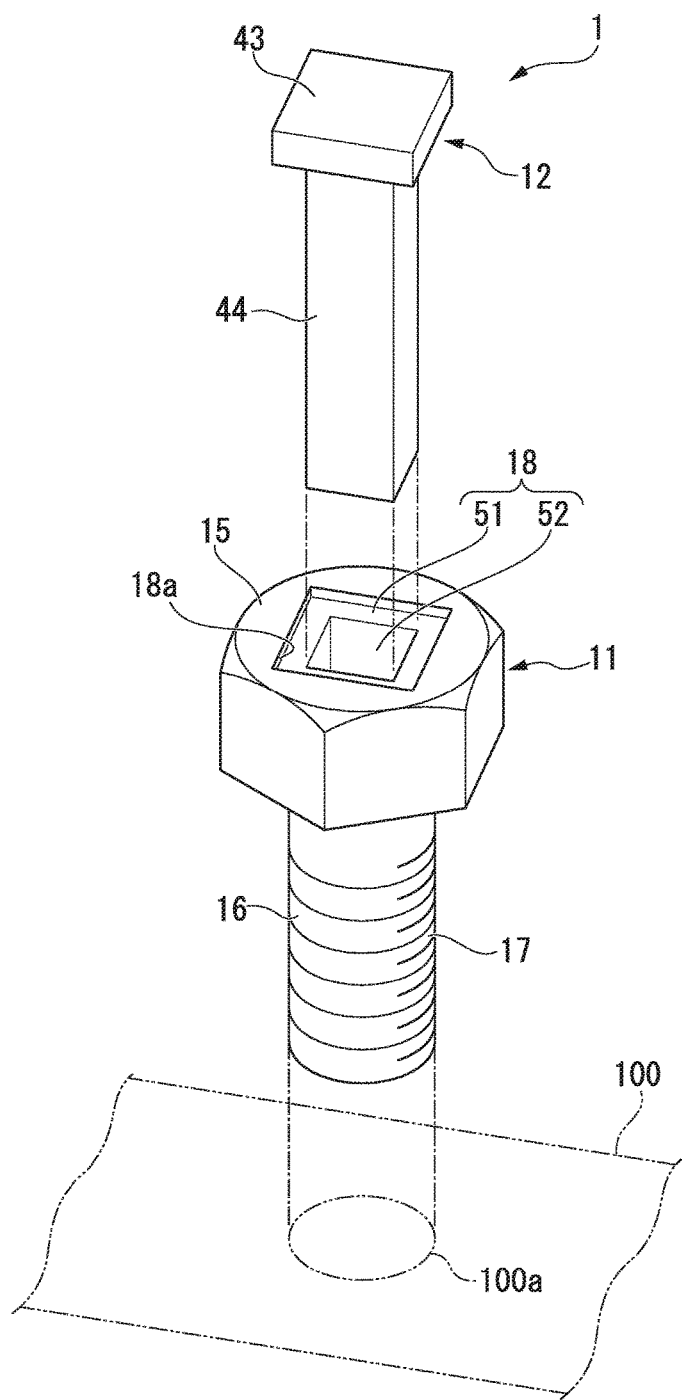
FIG. 1 is a partially-exploded perspective view of a fastener including a wireless device according to a first embodiment.

FIG. 1 is a perspective diagram of an overall configuration of a fastener including the wireless device 1.

The wireless device 1 is an example of a "wireless apparatus", a "communication unit", and an "electronic apparatus". As illustrated in FIG. 1, the fastener (e.g., screw and bolt) includes a main body 11, and the wireless device 1 includes a sensor unit 12 that is mountable to the main body 11.

The main body 11 of the fastener (hereinafter, fastener 11) is, for example, a metallic bolt (e.g., a hex head bolt). The fastener 11 includes a head 15 and a thread body 16. The head 15 is formed in a polygonal shape (e.g., hexagonal shape). The thread body 16 is formed in a cylindrical shape thinner than the head 15, and is connected (i.e., fixed) to the head 15. An external peripheral surface of the thread body 16 includes multiple screw threads (typically, helical threads). The thread body 16 is inserted into a screw hole (i.e., threaded hole) 100a of a fixation object (i.e., object to be fixed) 100, and engaged with the fixation object 100. It is possible to utilize the fastener 11 of the present embodiment in a variety of fields, for example shelves, air conditioners, bridges, building, railways, vehicles, and the like.

As illustrated in FIG. 1, a mounting hole (i.e., housing) 18 for mounting the sensor unit 12 is formed in the fastener 11. A mounting structure of the sensor unit 12 to the fastener 11 is described below in detail.

[1. Sensor Unit]

Figure 2:
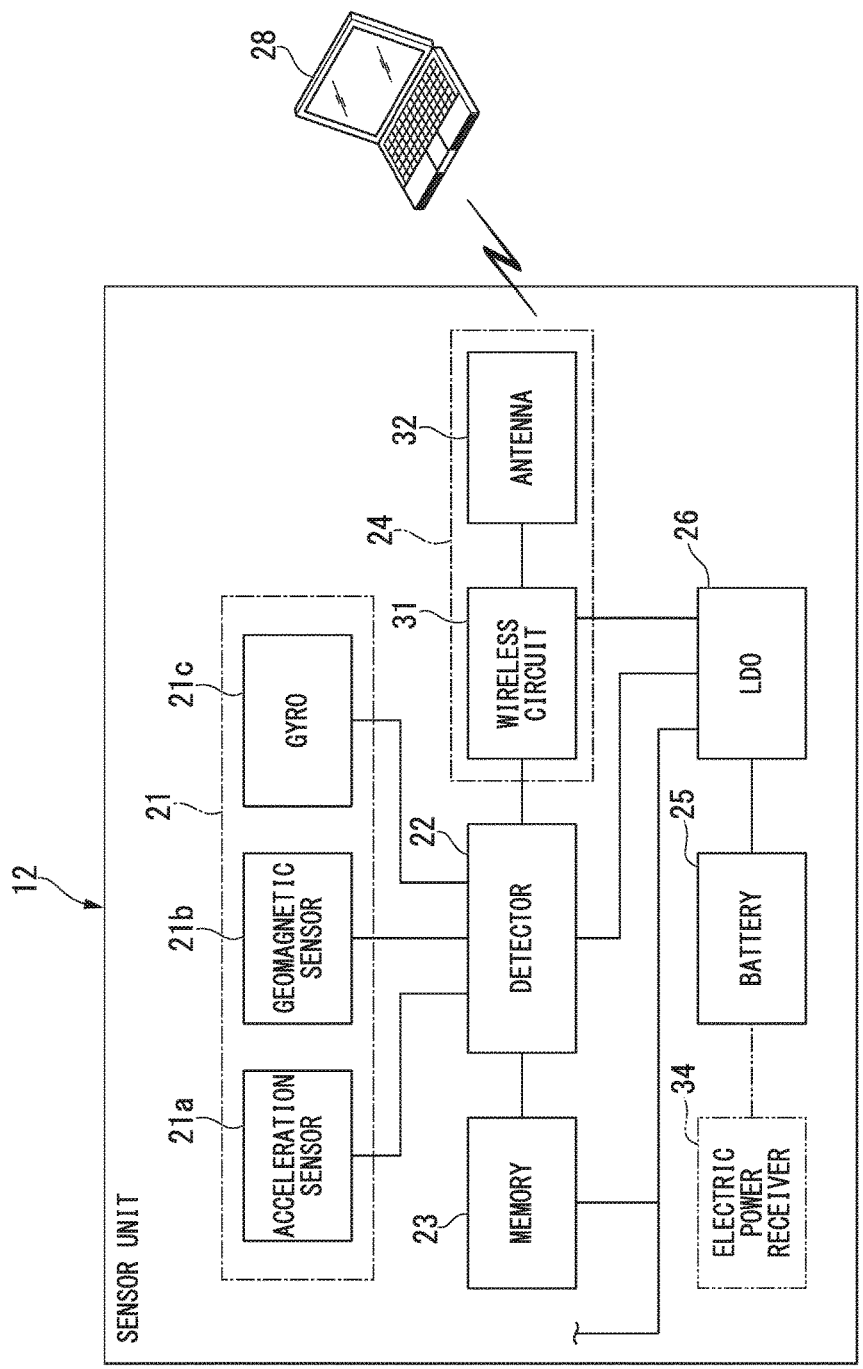
FIG. 2 is a block diagram of a system configuration of the wireless device according to the first embodiment.

FIG. 2 is a block diagram of a system configuration of the sensor unit 12. As illustrated in FIG. 2, the sensor unit 12 includes a sensor (e.g., sensor module) 21, a detector 22, a memory 23, a wireless module 24 a battery 25, and an electric power supply component 26.

The sensor 21 includes an acceleration sensor 21a, a geomagnetic sensor 21b, and a gyro 21c.

The acceleration sensor 21a is an inertial sensor that measures acceleration, and can detect a gravitational force direction. The acceleration sensor 21a of the present embodiment is, for example, a three-axis acceleration sensor. That is, the acceleration sensor 21a measures acceleration in each of three substantially mutually orthogonal directions: an X-axis direction, a Y-axis direction, and a Z-axis direction. The acceleration sensor 21a outputs acceleration measurement results in each of the X-axis direction, the Y-axis direction, and the Z-axis direction to a detector 22 described below.

The geomagnetic sensor 21b is a sensor that measures geomagnetism, and can detect a magnetic flux direction. The geomagnetic sensor 21b of the present embodiment is, for example, a three-axis geomagnetic sensor. That is, the geomagnetic sensor 21b measures geomagnetism in each of three substantially mutually orthogonal directions: an X-axis direction, a Y-axis direction, and a Z-axis direction. The geomagnetic sensor 21b outputs geomagnetism measurement results in each of the X-direction, the Y-direction, and the Z-direction to the detector 22.

The gyro (i.e., gyro sensor) 21c is an example of a "vibration detection sensor", and can detect vibrations imparted to the fastener 11. The gyro 21c of the present embodiment is, for example, a three-axis gyro. That is, the gyro 21c measures vibrations in each of three substantially mutually orthogonal directions: an X-axis direction, a Y-axis direction, and a Z-axis direction. The gyro 21c outputs vibration measurement results in each of the X-direction, the Y-direction, and the Z-direction to the detector 22.

The sensor 21 of the present embodiment is thus a nine-axis sensor that is capable of measuring acceleration in three axes, geomagnetism in three axes, and vibration in three axes. In the present embodiment, the sensor 21 is coupled with the fastener 11 as a portion of the sensor unit 12. In other words, the sensor 21 is fixed to the fastener 11. In the present embodiment, "a sensor is fixed to a fastener" includes a case where the sensor is fixed to the fastener with another member (e.g., protection member or attaching member) interposed between the sensor and the fastener, in addition to a case the sensor is directly fixed to the fastener. When the orientation of the fastener 11 changes, the orientation of the sensor 21 changes corresponding to the changes in the orientation of the fastener 11. For example, when the fastener 11 rotates, the sensor 21 rotates integrally with the fastener 11. The sensor 21 thus generates outputs as detection results based on changes in the orientation of the fastener 11. For example, as one example of the detection results, the sensor 21 outputs values based on changes in the orientation of the fastener 11. As one example of the detection results, the sensor 21 may generate outputs which represent changes in the orientation of the fastener 11.

In the present disclosure, when discussing a "value", for example a "value based on a change" as described above, the "value" is not limited to a measured value, and further, is not limited to a numerical value. "Value" may be an indicator which indicates an attribute, for example High/Low.

Further, the sensor 21 may also output other detection results instead of those described above. For example, the sensor 21 may also output results of processes such as corrections, adjustments, screenings, or the like performed on measured values from the acceleration sensor 21a, the geomagnetic sensor 21b, or the gyro 21c. That is, in the present disclosure, a "detection result (or measurement result)" may also be obtained by performing a computation process, a determination process, or the like defined in advance on a measured value. For example, the sensor 21 may also output information that indicates which of multiple predefined partitions a measured value is included. For example, the sensor 21 may output identical values when changes in the orientation of the fastener 11 are minute (e.g., rotation is equal to or less than 0.5°).

Further, in the present disclosure "changes in the orientation of the fastener" means changes equal to or greater than the size of the smallest unit capable of being resolved by the sensor 21 relating to the orientation of the fastener 11. That is, all changes, even minute changes, equal to or greater than the size of the smallest unit capable of being resolved by the sensor 21 correspond to "changes in the orientation of the fastener".

Further, in the present disclosure "changes in the orientation of the fastener" includes rotation (e.g., looseness) of the fastener 11 with respect to the fixation object 100, changes in inclination of a center axis C of the fastener 11 (refer to FIG. 3), and the like. "Rotation of the fastener with respect to the fixation object" as used here means rotation around the center axis C of the fastener 11 (i.e., a center axis of the thread body 16). Further, "changes in inclination of the center axis of the fastener" includes changes in inclination of the fastener 11 with respect to the fixation object 100, and changes in inclination of the fastener 11 due to inclination of the fixation object 100.

In the present embodiment, when the fastener 11 rotates with respect to the fixation object 100 (i.e., for cases where the fastener 11 is getting loose), the orientation of the acceleration sensor 21a changes. When the orientation of the acceleration sensor 21a changes, the direction of the gravitational force detected by the acceleration sensor 21a changes. The acceleration sensor 21a thus outputs different values corresponding to rotation of the fastener 11, for example.

Further, when the fastener 11 rotates with respect to the fixation object 100 (i.e., for cases where the fastener 11 gets loose), the orientation of the geomagnetic sensor 21b changes. When the orientation of the geomagnetic sensor 21b changes, the magnetic flux direction of the earth detected by the geomagnetic sensor 21b changes. The geomagnetic sensor 21b thus outputs different values corresponding to rotation of the fastener 11, for example.

In addition, in the present embodiment, the inclination of the acceleration sensor 21a changes when the inclination of the center axis C of the fastener 11 changes. When the inclination of the acceleration sensor 21a changes, the direction of the gravitational force detected by the acceleration sensor 21a changes. The acceleration sensor 21a thus outputs different values corresponding to changes in the inclination of the center axis C of the fastener 11, for example.

Further, when the inclination of the center axis C of the fastener 1 changes, the inclination of the geomagnetic sensor 21b changes. When the inclination of the geomagnetic sensor 21b changes, the magnetic flus direction of the earth detected by the geomagnetic sensor 21b changed. The geomagnetic sensor 21b thus outputs different values corresponding to changes in the inclination of the center axis C of the fastener 11, for example.

In addition, in the present embodiment, when vibrations act on the fastener 11, the gyro 21c outputs different values corresponding to the size of vibrations, for example.

The memory 23 and the detector 22 are described next. The memory 23 is a semiconductor memory component included in a Micro Controller Unit (MCU) 46 described below, for example. The memory 23 is a non-volatile memory, for example. The memory 23 receives output from the sensor 21 through the detector 22, for example.

In detail, the wireless device 1 is initialized when the fastener 11 is mounted to the fixation object 100, for example. The memory 23 receives output from the sensor 21 when the wireless device 1 is initialized. The memory 23 stores the output from the sensor 21 at initialization as an initial state value (i.e., zero correction value). The detector 22, described below, can thus set a zero value based on the value stored in the memory 23. Here, initialization of the wireless device 1 may also be performed by striking the wireless device 1 to input a shock to the wireless device 1, or the like, after the fastener 11 is mounted to the fixation object 100. Alternatively, the initialization may be performed by wireless communication from an external apparatus 28 through a wireless circuit 31 and an antenna 32 described below.

Further, at least one standard value (e.g., multiple standard values) for determining changes in the orientation of the fastener 11 (e.g., degrees of the orientation change) is stored in the memory 23. The standard values are one example of "values set in advance". The standard values may be set, for example, for each of the three axes of acceleration and the three axes of geomagnetism.

In detail, at least one standard value (e.g., multiple standard values) for determining the degree of rotation (e.g., degree of looseness) of the fastener 11 with respect to the fixation object 100 is stored in the memory 23. The standard values include, for example, values of changes in the three axes of acceleration, values of changes in the three axes of geomagnetism, and the like for cases of predefined angles of rotation of the fastener 11 with respect to the fixation object 100 (e.g., 10 degrees, 30 degrees, 90 degrees, one rotation, three rotations).

Further, at least one standard value (e.g., multiple standard values) for determining the degree of changes in inclination of the center axis C of the fastener 11 is stored in the memory 23. The standard values include, for example, values of changes in the three axes of acceleration, values of changes in the three axes of geomagnetism and the like for cases of predefined inclination angles of the center axis C of the fastener 11 with respect to the an initial state of the center axis C of the fastener 11 (e.g., 1 degree, 3 degrees, 5 degrees, 10 degrees).

In addition, at least one standard value (e.g., multiple standard values) for determining (i.e., estimating) a state of the fastener 11 (e.g., a deterioration state of the fastener 11) is stored in the memory 23. The standard values are one example of "values set in advance". In the present embodiment, the standard values are set for the three axis gyro 21c, for example.

Specifically, at least one standard value (e.g., multiple standard values) for determining (i.e., estimating) a deterioration state of the fastener 11 due to vibrations is stored in the memory 23. The standard values include, for example, the total amount of vibration in three axes (e.g., the total amount of vibration in each of the three axes) for cases where deterioration of the fastener 11 has advanced to a predefined degree. Here, the standard values relating to vibration may be set based on past statistical data of the fastener 11 in similar equipment, for example. Also, all of the standard values described above can be set or changed by wireless communication from the external apparatus 28 through the wireless module 24 described below.

The detector (e.g., detection circuit) 22 is implemented by a part of circuitry included in the MCU 46, for example. The detector 22 of the present embodiment detects changes in the orientation of the fastener 11, and estimates (e.g., determines) the degree of deterioration of the fastener 11, based on output from the sensor 21.

In detail, the detector 22 receives output from the sensor 21. For example, at predefined sampling periods the detector 22 receives a measured value from the acceleration sensor 21a relating to the three axes, a measured value from the geomagnetic sensor 21b relating to the three axes, and a measured value from the gyro 21c relating to the three axes.

In the present disclosure, a "measured value" is a value obtained by measurement. On the other hand, for cases where "value" is described, such as a "value obtained from output of the sensor 21", the "value" is not limited to a measured value, nor is the "value" limited to a numerical value, as described above. The "value" may also be indicator which indicate an attribute such as High/Low, for example. Further, in the present disclosure, "output" means at least one of an electronic signal output by the sensor 21 based on a detection result of the sensor 21, and information contained in the electronic signal. "Output" of the sensor 21 as described in the present disclosure can thus be read as a "detection result of the sensor".

The detector 22 detects changes in the orientation of the fastener 11, and estimates (e.g., determines) the degree of deterioration of the fastener 11, based on a value obtained from output of the sensor 21. For example, the detector 22 detects changes in the orientation of the fastener 11, and estimates (e.g., determines) the degree of deterioration of the fastener 11, based on a value obtained from output of the sensor 21 and the above-described standard values. In the present disclosure, "based on" means "based at least on".

That is, in the present disclosure, "based on a specific basis" includes both cases of "based on" a single specific basis, as well as cases of "based on" another specific basis, as well as the single specific basis.

In the present embodiment, the detector 22 detects changes in the orientation of the fastener 11, and determines the degree of deterioration of the fastener 11, by comparing a value obtained from output of the sensor 21 with the standard values. Here, "value obtained from output of the sensor 21" is, for example, a value obtained by deducting the zero correction value set during initialization from output by the sensor 21 (i.e., amount of change from the zero value). "value obtained from output of the sensor 21" may also be an actual measured value included in output of the sensor 21, and may also be a value generated from the output of the sensor 21 by performing a predefined computation process or determination process on the measured value. That is, "a value obtained from output of the sensor" in the present disclosure can thus be read as "a value included in or generated from output of the sensor". For example, when a value obtained from output of the sensor 21 is equal to or greater than a first standard value included in the standard values, the detector 22 detects a state that the rotation (e.g., looseness), inclination, or degree of deterioration of the fastener 11 has advanced to a first state. Further, when a value obtained from output of the sensor 21 is equal to or greater than a second standard value included in the standard values, the second standard value being larger than the first standard value, the detector 22 detects a state that the rotation (e.g., looseness), inclination, or degree of deterioration of the fastener 11 has advanced to a second state. On the other hand, when a value obtained from output of the sensor 21 is less than a first standard value included in the standard values, the detector 22 detects a state that the rotation (e.g., looseness), inclination, or degree of deterioration of the fastener 11 has not advanced to the first state. Further, when a value obtained from output of the sensor 21 is equal to or greater than the first standard value included in the standard values, and less than the second standard value, the detector 22 detects a state that the rotation (e.g., looseness), inclination, or degree of deterioration of the fastener 11 has advanced to the first state but has not advanced to the second state.

In the present embodiment, the detector 22 detects the degree of rotation of the fastener 11 with respect to the fixation object 100 by comparing a value obtained from (i.e., a value included in or generated from) output of the accelerator sensor 21a to the standard values set for the acceleration sensor 21a. Further, the detector 22 detects the degree of rotation of the fastener 11 with respect to the fixation object 100 by comparing a value obtained from (i.e., a value included in or generated from) output of the geomagnetic sensor 21b to the standard values set for the geomagnetic sensor 21b. Alternatively, the detector 22 may be instead used to determine only whether or not rotation of the fastener 11 exceeds a predefined standard amount.

In addition, in the present embodiment, the detector 22 detects changes in inclination of the center axis C of the fastener 11 by comparing a value obtained from (i.e., a value included in or generated from) output of the accelerator sensor 21a to the standard values set for the acceleration sensor 21a. Further, the detector 22 detects changes in inclination of the center axis C of the fastener 11 by comparing a value obtained from (i.e., a value included in or generated from) output of the geomagnetic sensor 21b to the standard values set for the geomagnetic sensor 21b. Alternatively, the detector 22 may be instead used to detect only whether or not inclination of the center axis C of the fastener 11 exceeds a predefined standard amount.

In addition, in the present embodiment, the detector 22 is used to determine the degree of deterioration of the fastener 11 due to vibration by comparing a value obtained from (i.e., a value included in or generated from) output of the gyro 21c to the standard values set for the gyro 21c. The detector 22 may be instead used to determine only whether or not the degree of deterioration of the fastener 11 exceeds a predefined standard amount.

The detector 22 transmits detection results relating to changes in the orientation of the fastener 11, and detection results of the degree of deterioration of the fastener 11, to the external apparatus 28 described below through the wireless module 24. For example, the detector 22 transmits detection results relating to rotation of the fastener 11 with respect to the fixation object 100, and detection results relating to changes in inclination of the center axis C of the fastener 11, detected based on output of the acceleration sensor 21a and the geomagnetic sensor 21b, to the external apparatus 28. Further, the detector 22 transmits detection results relating to the degree of deterioration of the fastener 11 detected based on output of the gyro 21c to the external apparatus 28.

Here, detection operations of the detector described above are not limited to the ones being performed based on the standard values. For example, the detector may instead detect changes in the orientation of the fastener 11, and be used to determine the degree of deterioration of the fastener, by comparing a new value output from the sensor 21 with a past value output from the sensor 21. That is, the detector 22 may also detect a state that rotation (e.g., looseness), inclination, or the degree of deterioration of the fastener 11 has advanced when a newly output value obtained from the sensor 21 exceeds a predefined amount compared to a past value obtained from the sensor 21. On the other hand, the detector 22 may also detect a state that rotation (e.g., looseness), inclination, or the degree of deterioration of the fastener 11 has not advanced when a newly output value obtained from the sensor 21 does not exceed a predefined amount compared to a past value obtained from the sensor 21.

Figure 3:
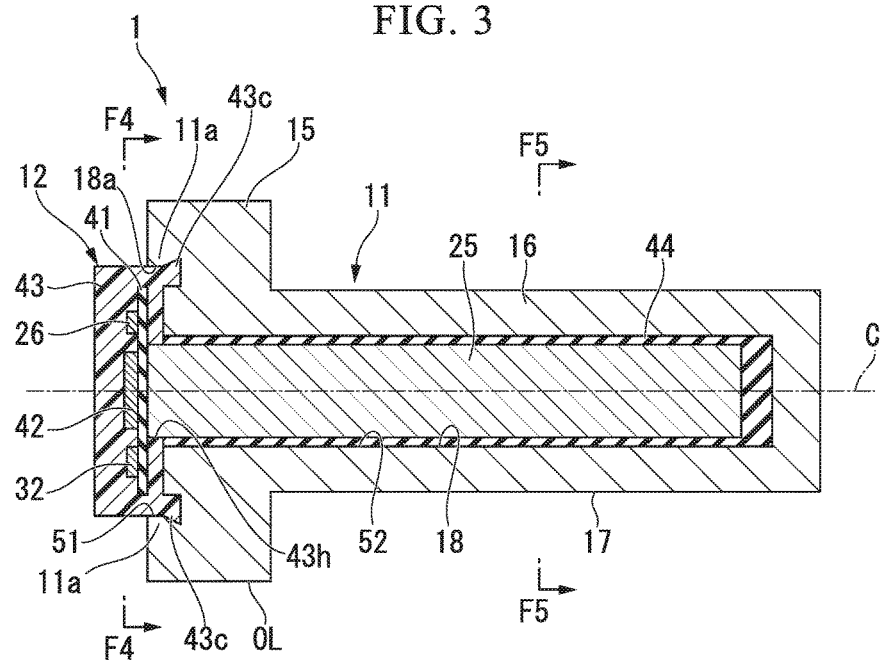
FIG. 3 is a cross-section of the wireless device according to the first embodiment.

The wireless module 24 refers to a module configured to at least transmit a signal or signals. The module can be implemented by hardware. The wireless module 24 includes, but is not limited to, circuitry and at least an antenna. For example, the wireless module 24 may include any additional structural element in addition to the circuitry and the antenna. The circuitry may be electrically coupled to the antenna. The circuitry may include, but not limited to, a wireless circuit 31 in FIG. 3. In FIG. 3, the wireless module 24 includes the wireless circuit 31 and the antenna 32. The antenna may be, but not limited to, the antenna 32 in FIG. 3. The wireless circuit 31 may be connected to the antenna 32.

The wireless circuit 31 converts signals representing information received from the detector 22 into signals capable of being output from the antenna 32. The wireless circuit 31 of the present embodiment is a wireless circuit conforming to the standards of, for example, Bluetooth (trademark). However, the wireless circuit 31 is not limited to the example described above. For example, the wireless circuit 31 may conform to communication standards utilized by Zigbee (trademark), Near Field Communication (NFC), or the 920 MHz band.

The antenna 32 is electrically connected to the wireless circuit 31. The antenna 32 may be a chip antenna, or may be a pattern of conductor on a surface of a circuit board 41 described below. The antenna 32 transmits signals received from the wireless circuit 31 to the external apparatus 28 as a wireless radio wave.

Further, in the present embodiment, identification information (i.e., identifier, e.g., an identification ID) may be assigned to the wireless module 24. The identification information is one example of identification information capable of distinguishing the fastener 11, to which the wireless device 1 is mounted, from other fasteners 11. The wireless module 24 transmits the identification information of the wireless module 24 to the external apparatus 28. When the wireless module 24 does not have identification information, or when necessary, identification information (i.e., identifier) may also be assigned to the wireless device 1. In this case, the wireless module 24 may also transmit identification information assigned to the wireless device 1 to the external apparatus 28 as a substitute for the identification information of the wireless module 24, or in addition to the identification information of the wireless module 24.

In the present embodiment, the wireless module 24 transmits information from output of the sensor 21, and the identification information described above, to the external apparatus 28 through the antenna 32 as a wireless radio wave. The wireless module 24 transmits the information and the identification information described above to the external apparatus 28 periodically (e.g., once per 24 hour period). "Information obtained from output of the sensor" may be an actually-measured value included in output from the sensor 21, and may also be information obtained by performing a predefined computation process, determination process, or the like on the measured value. In the present embodiment, the wireless circuit 31 transmits detection results from the detector 22 as "information obtained from output of the sensor". That is, "information obtained from output of the sensor" in the present disclosure can thus be read as a "information included in or generated from output of the sensor". For example, "detection results from the detector" includes detection results relating to rotation of the fastener 11 with respect to the fixation object 100, detection results relating to changes in inclination of the center axis C of the fastener 11, detection results relating to deterioration of the fastener 11, and the like.

Further, the wireless module 24 receives a radio wave output from the external apparatus 28. A user of the wireless device 1 can thus make changes to the initialization settings and the standard values stored in the memory 23, and changes to the timing at which the detection results are sent from the detector 22, and the like.

Here, the external apparatus (e.g., information processing device) 28 to which the wireless device 1 transmits information may be an electronic device like a tablet terminal, smart phone, or portable computer, and may also be a communications device (e.g., repeater) connected to a network N.

The battery 25 supplies electronic power to the sensor 21, the detector 22, the memory 23, and the wireless circuit 31 through the electric power supply component 26 described below. The battery 25 may be a primary cell battery, and may also be a secondary cell battery. When the battery 25 is a secondary cell battery, an electric power receiver 34 used for wireless electric charging (e.g., an electricity receiving coil) may also be provided to the circuit board 41 described below (refer to FIG. 3).

The electric power supply component (i.e., electric power circuit component) 26 is electrically connected to the battery 25, and is also electrically connected to the sensor 21, the detector 22, the memory 23, and the wireless circuit 31. The electric power supply component 26 is, for example, a low dropout linear regulator (LDO). The electric power supply component 26 converts a voltage supplied from the battery 25 into voltages required by each component 21, 22, 23, and 31. In the present disclosure, "electric power supply component" is not limited to an LDO, and may also be another component relating to an electric power circuit.

[1-2. Structure of Sensor Unit]

FIG. 3 illustrates a cross-section of the wireless device 1. As illustrated in FIG. 3, the wireless device 1 includes the circuit board 41, the chip component 42, the electric power supply component 26, the antenna 32, a housing 43, the battery 25, and a battery protection member 44.

The circuit board (i.e., board) 41 is formed in a rectangular plate shape, and located outside the fastener 11. The circuit board 41 is arranged with the head 15 of the fastener 11 in a direction along the center axis C of the fastener 11. The chip component 42, the electric power supply component 26, and the antenna 32 are mounted on a surface of the circuit board 41, and electrically connected to the circuit board 41. The chip component 42, the electric power supply component 26, and the antenna 32 are located on a side of the circuit board 41 opposite to a side of the circuit board 41 facing the fastener 11 and the battery 25.

The chip component (e.g., semiconductor component) 42 includes the sensor 21, the MCU 46, and the wireless circuit 31 described above. The chip component 42 is a component in which the sensor 21, the MCU 46, and the wireless circuit 31 are sealed together using a molding resin 47 (refer to FIG. 4). Further, the MCU 46 is a semiconductor component including the detector 22 and the memory 33 described above.

The housing 43 is an example of a container, and is exposed to the outside of the wireless device 1. The housing 43 accommodates the circuit board 41, the chip component 42, the electric power supply component 26, and the antenna 32. For example, the housing 43 is a molded resin that seals the circuit board 41, the chip component 42, the electric power supply component 26, and the antenna 32 together. That is, the housing 43 is made from a synthetic resin, and allows a wireless signal radio wave to pass. Further, a through hole 43*h* through which the battery 25 passes is formed in the housing 43. By passing through the through hole 43*h*, the battery 25 is electrically connected to the circuit board 41.

The housing 43 is smaller than a diameter of the head 15 of the fastener 11. In other words, when looking in a direction along the center axis C of the fastener 11, the housing 43 is within an outline OL (i.e., within an area defined by the side edge) of the head 15 (refer to FIG. 4). That is, the circuit board 41, the sensor 21, the electronic component 26, the wireless circuit 31, and the antenna 32 (in other words, the entire sensor unit 12) are disposed inside the outline OL of the head 15 when viewed in a direction along the center axis C of the fastener 11.

Figure 4:
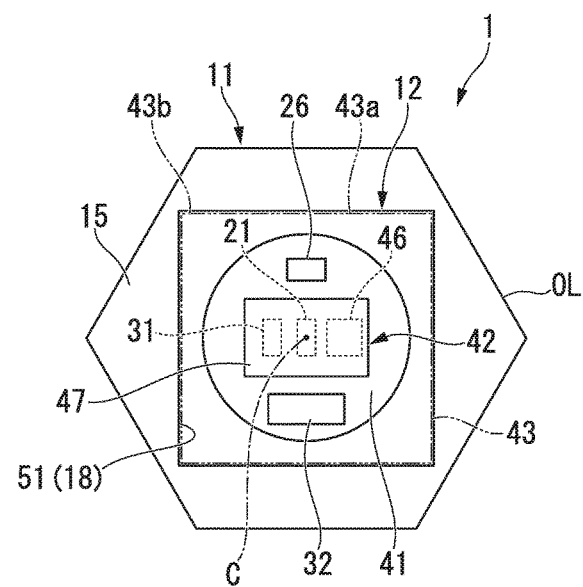
FIG. 4 is a cross-section of the wireless device shown in FIG. 3 taken along a line segment F4-F4 in FIG. 3.

FIG. 4 is a cross-section of the wireless device 1 illustrated in FIG. 3 taken along a line segment F4-F4 in FIG. 3. For convenience, the housing 43 is illustrated by a two-dot chain line in FIG. 4

As illustrated in FIG. 4, compared to at least a part of the electric power supply component 26, the chip component 42 (e.g., sensor 21) is disposed closer to the center axis C of the fastener 11. Further, taken from another viewpoint, at least a part of the chip component 42 is disposed in a position overlapping the center axis C of the fastener 11. Stated further, of the chip component 42, the sensor 21 is disposed in a location overlapping the center axis C of the fastener 11.

As illustrated in FIG. 3, the fastener 11 of the present embodiment includes the mounting hole 18 that accommodates at least a part of the sensor unit 12. The mounting hole 18 is an example of a "hole". The mounting hole 18 is formed along the center axis C of the fastener 11. The mounting hole 18 is formed from the head 15 to the thread body 16 of the fastener 11. Further, the mounting hole 18 has an opening portion 18*a* formed in the head 15 of the fastener 11. The mounting hole 18 can be exposed to the outside of the wireless device 1 through the opening portion 18*a*.

More specifically, the mounting hole 18 includes a first portion 51 and a second portion 52. The first portion 51 is formed in the head 15 of the fastener 11 and accommodates a part of the housing 43. As illustrated in FIG. 4, the housing 43 is a box shape formed in a polygonal shape (e.g., a rectangular shape) here. In other words, the housing 43 includes a first portion 43*a* at a first distance from the center axis C, and a second portion 43*b* at a second distance from the center axis C. The second distance is longer than the first distance. The first portion 51 of the mounting hole 18 has a shape corresponding to an outer shape of the housing 43. The housing 43 is inserted into the first portion 51 of the mounting hole 18. That is, the first portion 51 of the mounting hole 18 has an edge along the first portion 43*a* of the housing 43, and an edge along the second portion 43*b* of the housing 43. The housing 43 thus rotates along with rotation of the fastener 11 when the fastener 11 rotates with respect to the fixation object 100.

Further, as illustrated in FIG. 3, the housing 43 has a claw (i.e., catch portion) 43*c* to be fixed to the fastener 11. The claw 43*c* has elasticity, is made from a synthetic resin, for example, and engaged to an engaging portion 11*a* of the fastener 11. The housing 43 is relatively easily fixed to the fastener 11 by the claw 43*c* of the housing 43 being detachably attached to the engaging portion 11*a* of the fastener 11.

The second portion 52 of the mounting hole 18 is provided in the head 15 and the thread body 16 of the fastener 11. An opening surface area of the second portion 52 is smaller compared to an opening surface area of the first portion 51. The battery 25 of the present embodiment has a cylindrical shape along the center axis C of the fastener 11. The battery 25 is inserted into the second portion 52 of the mounting hole 18, and is accommodated in the second portion 52 of the mounting hole 18.

The battery protection member 44 is provided between the battery 25 and an inner surface (e.g., inner circumferential surface and base surface) of the second portion 52 of the mounting hole 18. The battery protecting member 44 is a made from a synthetic resin, and has insulating properties (e.g., electric insulating properties). Here, the battery protecting member 44 may also be an insulating film member.

Figure 5:
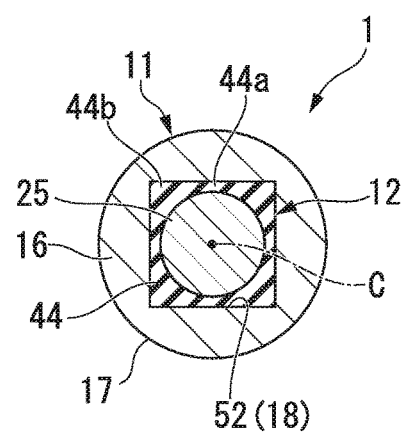
FIG. 5 is a cross-section of the wireless device shown in FIG. 3 taken along a line segment F5-F5 in FIG. 3.

FIG. 5 is a cross-section of the wireless device 1 illustrated in FIG. 3 taken along a line segment F5-F5 in FIG. 3.

As illustrated in FIG. 5, the battery protecting member 44 has an outer shape formed in polygonal shape (e.g., a rectangular shape). In other words, the battery protecting member 44 includes a first portion 44*a* at a first distance from the center axis C, and a second portion 44*b* at a second distance from the center axis C. The second distance is longer than the first distance. The second portion 52 of the mounting hole 18 has a shape corresponding to an outer shape of the battery protecting member 44. The battery protecting member 44 is inserted in the second portion 52 of the mounting hole 18. That is, the second portion 52 of the mounting hole 18 has an edge along the first portion 44*a* of the battery protecting member 44, and an edge along the second portion 44b. The battery protecting portion 44 thus rotates along with rotation of the fastener 11 when the fastener 11 rotates with respect to the fixation object 100.

Here, the shapes of the housing 43, the battery protecting portion 44, and the mounting hole 18 are not limited to the example described above. For example, the sensor unit 12 may also rotate along with rotation of the fastener 11 by being fixed to the fastener 11 using an adhesive.

The sensor unit 12 is detachably attached to the fastener 11. That is, the sensor unit 12 is capable of being dismounted from the fastener 11. For example, when the battery 25 level has gotten low, the sensor unit 12 may be replaced by a new sensor unit 12.

[2. Detection System]

Figure 6:
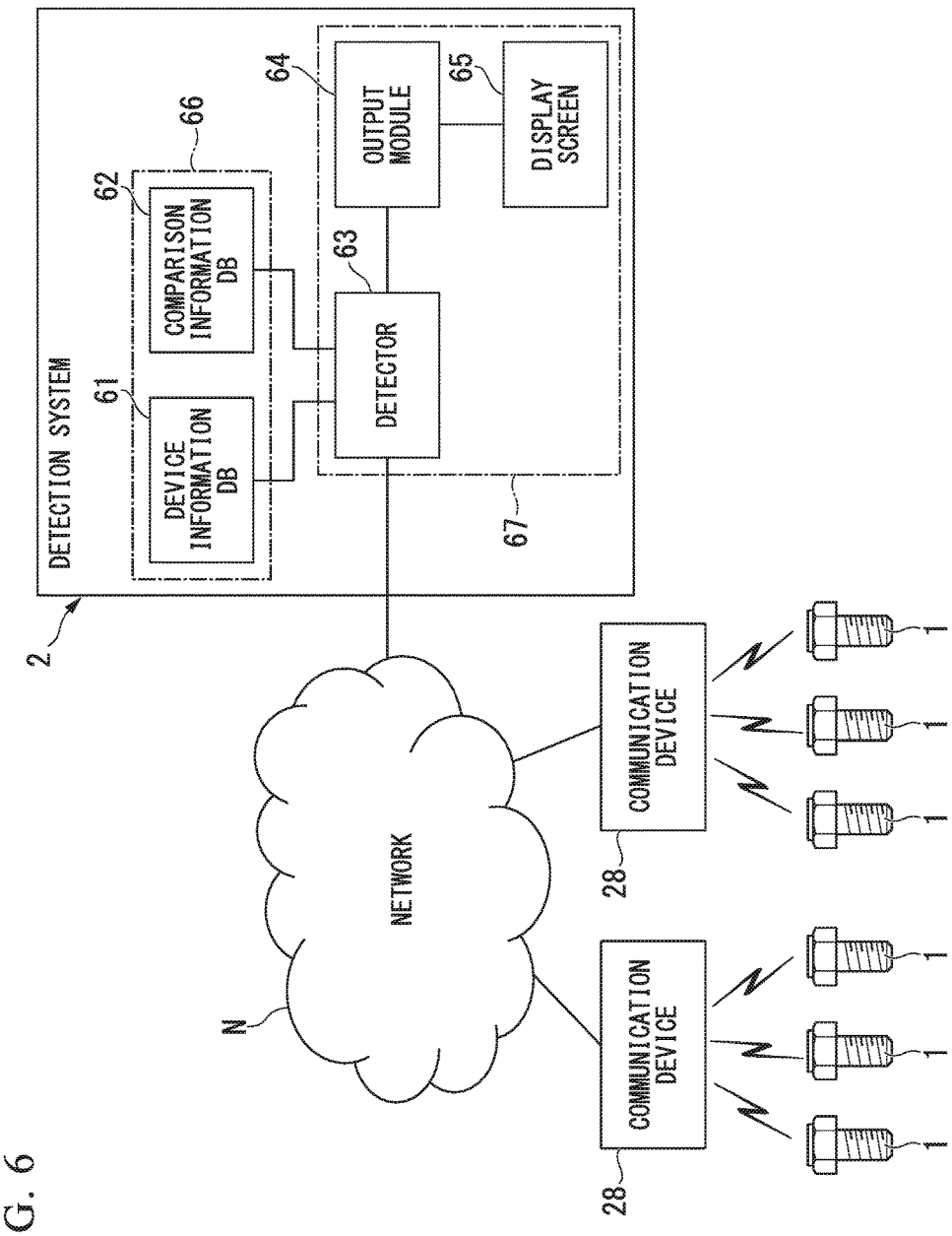
FIG. 6 is a block diagram of a system configuration of a detection system according to the first embodiment.

The detection system (e.g., detection center, information processing system) 2 using the wireless device 1 is described below. FIG. 6 is a block diagram of a system configuration of the detection system 2.

The detection system 2 of the present embodiment detects a state of the fastener 11, and a state of the fixation object 100 to which the fastener 11 is mounted, based on information from multiple wireless devices 1.

As illustrated in FIG. 6, the detection system 2 acquires information from multiple wireless devices 1 through, for example, the external apparatus (e.g., communication device) 28 and the network N.

More specifically, the detection system 2 includes a device information database (device information DB) 61, a comparison information database (comparison information DB) 62, a detector 63, an output module 64, and a display screen 65. The device information DB 61 and the comparison information DB 62 are implemented by a server 66 included in the detection system 2, for example. Further, the detector 63 and the output module 64 are implemented by information processing device 67 (e.g., additionally more specifically, a circuit board, a processor, and a memory of the information processing device 67) included in the detection system 2, for example.

The device information DB (e.g., wireless device information DB and fastener information DB) 61 stores information relating to multiple wireless devices 1 (i.e., multiple fasteners 11). That is, the wireless device information DB 61 stores setting locations, setting states (e.g., setting orientations) and the like for each wireless device 1, and associated identification information (e.g., the identification information described above) for each wireless device 1.

The comparison information DB (e.g., statistical information DB) 62 stores previously acquired information (e.g., statistical data) relating to output from wireless devices 1 in similar installations (e.g., equipment, facilities). That is, the comparison information DB 62 stores output from each wireless device 1 in a similar installation obtained previously, and associated actual states of the fastener 11 of each wireless device 1 (e.g., the degree of looseness, or the degree of deterioration, of the fastener 11). For example, the comparison DB 62 stores information relating to vibrations acting on the fastener 11 of each wireless device 1, and associated actual states of the fastener 11 of each wireless device 1 (e.g., the degree of deterioration of the fasteners 11).

Further, the comparison DB 62 stores previously acquired information output from multiple wireless devices 1 in similar installations, and associated actual states of the fixation object 100 (e.g., the degree of deterioration of the fixation objects 100).

The detector (e.g., detector circuit) 63 of the present embodiment estimates (e.g., determines) the degree of deterioration of the fastener 11 based on information from each wireless device 1. For example, the detector 63 receives values obtained from (i.e., included in or generated from) output by the gyro 21c of each wireless device 1. The detector 63 estimates (e.g., determines) the degree of deterioration of the fastener 11 based on values obtained from (i.e., included in or generated from) output of the gyros 21c and information stored in the device information DB 61 and the comparison information DB 62.

Further, the detector 63 estimates (e.g., determines) an overall state of the fixation object 100 to which multiple fasteners 11 are mounted (e.g., the overall state of deterioration of the fixation object 100) based on values obtained from (i.e., included in or generated from) output of the sensors 21 of each wireless device 1 and information stored in the device information DB 61 and the comparison information DB 62.

Here, each wireless device 1 need not have the detector 22 in the sensor unit 12. In this case, the wireless device 1 may transmit the output from the sensor 21, as is, to the detection system 2 through the external apparatus (e.g., communications device) 28. Further, the detector 63 of the detection system 2 may also have substantially the same function as the detector 22 of the sensor unit 12 described above. That is, the detector 63 of the detection system 2 may also detect changes in the orientation of the fastener 11 based on values obtained from (i.e., included in or generated from) the output of at least one of the acceleration sensor 21a and the geomagnetic sensor 21b. That is, the detector 63 of the detection system 2 may also detect changes in rotation of the fastener 11 with respect to the fixation object 100 and inclination of the center axis C of the fastener 11.

The output module (e.g., output circuit) 64 receives, from the detector 63, information detected by the detector 63. The output module 64 displays information related to the detection result of the detector 63 on the display screen 65.

The detection system 2 is not limited to a system that acquires information from the wireless device 1 through the network N. The detection system 2 may also be in the external apparatus 28, which is an electronic apparatus (e.g., information processing device) such as a smart phone, tablet terminal, or portable computer, for example.

A configuration described above may lead to reduction of inspections of the fastener 11. That is, the wireless device 1 of the present embodiment includes the sensor 21, antenna 22, and the wireless circuit 31. The sensor 21 is coupled with the fastener 11, and generates an output based on a change in the orientation of the fastener 11. The wireless circuit 31 transmits information included in or generated from the output of the sensor 21 outside the wireless device 1 through the antenna 32. That is, the wireless circuit 31 transmits at least the output of the sensor 21 and a signal which is generated based on the output of the sensor 21.

According to such a configuration, when a change in the orientation develops in a certain fastener 11 which is included multiple fasteners 11, the fastener 11 in which the change in the orientation has developed may be easily identified based on information from the sensor 21 via wireless communication. It may thus become unnecessary to perform inspection (i.e., total inspection at installation sites by inspectors) of all fasteners 11. Alternatively, the inspection frequency of the fasteners 11 may be reduced.

Further, according to the above configuration, wireless communication function achieved by the wireless device 1 and detection function achieved by the sensor unit 12 can be added to the fastener 11. Further, special work for installment of the sensor unit 12 to the fixation object 100 is not required.

In the present embodiment, the sensor 21 generates an output based on a change in direction of force acting on the sensor 21, where the change in direction of the force is caused by a change in the orientation of the fastener 11. According to such a configuration, a change in the orientation of the fastener 11 can be detected using a relatively small sensor compared to a sensor that is provided for directly detecting a change in the orientation (e.g., rotation) of the fastener 11. According to such a configuration, the wireless device 1 may thus be miniaturized and reductions in cost may be achieved. Here, "directly" detecting a change in the orientation means, for example, detecting a change in the orientation of the fastener 11 according to actual mechanical changes (i.e., actual rotation or movement) between a first member mounted on an outside circumference surface of the head 15 of the fastener 1, which moves according to changes (e.g., rotation) in the orientation of the fastener 11, and a second member fixed to the fixation object 100. On the other hand, the sensor 21 of the present embodiment detects a change in the orientation of the fastener 11 by detecting a change in the direction of force acting on the fastener 11 according to a change in the orientation of the fastener 11. According to such a configuration, it becomes possible to detect a change in the orientation of the fastener 11 by using a relatively small size chip mounted in a circuit board. The wireless device 1 may thus be miniaturized, and cost reduction may be achieved.

In the present embodiment, the sensor 21 generates an output based on a change in direction of force acting on the sensor 21 due to rotation of the fastener 11. According to such a configuration, loosening of the fastener 11 can be detected by detecting a change in direction of a force acting on the sensor 21 due to rotation of the fastener 11.

In the present embodiment, the sensor 21 generates an output based on at least one of a change in direction of a gravitational force acting on the sensor 21 and a change in direction of a force acting on the sensor 21 caused by geomagnetism. The direction of a force due to gravity or geomagnetism easily and certainly changes along with rotation of the fastener 11. Accordingly, a state of the fastener 11 may be easily and precisely detected by detecting at least one of a change in direction of gravity and a change in direction of a force caused by geomagnetism.

In the present embodiment, the sensor 21 includes at least one of the acceleration sensor 21a and the geomagnetic sensor 21b. According to such a configuration, at least one of a change in direction of the gravitational force acting on the sensor 21 and a change in direction of a force acting on the sensor 21 caused by geomagnetism can be detected.

In the present embodiment, at least one of the acceleration sensor 21a and the geomagnetic sensor 21b generates an output based on rotation of the fastener 11. According to such a configuration, loosening of the fastener 11 may easily be detected based on information from the sensor 21.

In the present embodiment, at least one of the accelerator sensor 21a and the geomagnetic sensor 21b rotates integrally with the fastener 11. According to such a configuration, rotation of the fastener 11 may be more accurately detected by the acceleration sensor 21a and the geomagnetic sensor 21b.

When the center axis C of the fastener 11 is along the direction of gravity, rotation around the center axis C of the fastener 11 may not be detected by using only output from the acceleration sensor 21a. Similarly, rotation around the center axis C of the fastener 11 may not be detected by only using output of the geomagnetic sensor 21b, depending upon the orientation of the fastener 11 installation.

In the present embodiment, the sensor 21 includes both the acceleration sensor 21a and the geomagnetic sensor 21b. According to such a configuration, since both the output of the acceleration sensor 21a and the output of the geomagnetic sensor 21b are used, a change in the orientation of the fastener 11 (e.g., rotation of the fastener 11) may be detected with high accuracy.

In the present embodiment, the sensor 21 includes a vibration detection sensor (e.g., the gyro 21c) for detecting a vibration of the fastener 11. According to such a configuration, the degree of deterioration of the fastener 11 due to vibrations may be determined based on information from the sensor 21.

In the present embodiment, the wireless device 1 includes the detector 22 that detects a change in the orientation of the fastener 11 by comparing a value included in or generated from output of at least one of the acceleration sensor 21a and the geomagnetic sensor 21b with a value set in advance. The wireless circuit 31 transmits information form the detector 22. According to such a configuration, the external apparatus 28 (or the detection system 2) can receive information relating to whether or not there is a change in the orientation of the fastener 11, and a degree of the orientation change, from the wireless device 1. The functions necessary for the external apparatus 28 (or for the detection system 2) may thus be reduced. A wireless device 1 with more convenience may thus be provided.

In the present embodiment, the fastener 11 is a bolt including the head 15 and the thread body 16. The sensor 21, the wireless circuit 31, and the antenna 32 are disposed within an area defined by the side edge of the head 15 when viewed in a direction along the center axis C of the thread body 16. According to such a configuration, the external shape of the fastener 11 does not easily increase, even when the sensor unit 12 is mounted to the fastener 11. Miniaturization of the wireless device 1 may thus be achieved. By using this kind of wireless device 1, there are fewer limitations on locations where the fastener 11 may be disposed.

In the present embodiment, the wireless device 1 includes the electric power supply component 26 which is electrically connected to the sensor 21. A farthest portion of the sensor 21 from the center axis C of the fastener 11 is closer to the center axis C than a farthest portion of the electric power supply component 26 from the center axis C. According to such a configuration, the sensor 21 is disposed near a center portion of the fastener 11. If the sensor 21 is disposed near a center portion of the fastener 11, the sensor 21 easily detects vibrations, no matter which direction the vibrations are input from, for example. The detection accuracy of the sensor 21 may thus be increased.

In the present embodiment, the wireless device 1 includes the chip component 42. The chip component includes the sensor 21. At least a part of the chip component 42 is disposed in a location overlapping the center axis C of the thread body 16 when viewed in a direction along the center axis C of the thread body 16. According to such a configuration, the sensor 21 is disposed additionally closer to a center portion of the fastener 11. If the sensor 21 is disposed additionally closer to a center portion of the fastener 11, the sensor 21 easily detects vibrations, no matter which direction the vibrations are input from, for example. The detection accuracy of the sensor 21 may thus be increased.

Further, when the acceleration sensor 21a and the geomagnetic sensor 21b are in a location apart from the center axis C of the fastener 11, it may be necessary to correct output from the acceleration sensor 21a and the geomagnetic sensor 21b. However, if the sensor 21 is disposed near the center axis C of the fastener 11 like in the present embodiment, the corrections described above may be omitted. A wireless device 1 having additionally high convenience may thus be provided.

In the present embodiment, the wireless device 1 includes the sensor unit 12. The sensor unit 12 includes the sensor 21, the wireless circuit 31, and the antenna 32. The mounting hole 18 that accommodates at least a part of the sensor unit 12 is formed in the fastener 11. According to such a configuration, miniaturization of the wireless device 1 may be achieved.

In the present embodiment, the fastener 11 is a bolt including the head 15 and the thread body 16. The head 15 has the mounting hole 18. According to such a configuration, a part of the sensor unit 12 may be accommodated in the head 15, which is larger in size compared to the thread body 16. Further miniaturization of the wireless device 1 may thus be achieved.

In the present embodiment, the sensor unit 12 includes the battery 25 for supplying an electric power to the sensor 21. The fastener 11 has the mounting hole 18 which penetrates the head 15 and reaches the thread body 16, and accommodates the battery 25. According to such a configuration, the sensor unit 12 may be accommodated by the relatively large mounting hole 18 across the head 15 and the thread body 16. Further miniaturization of the wireless device 1 may thus be achieved. Further, seen from another viewpoint, according to the configuration described above, a relatively large battery 25 may be disposed while also achieving miniaturization of the wireless device 1. By increasing the capacity of the battery 25, the battery life of the wireless device 1 may be lengthened.

In the present embodiment, the detection system 2 includes the detector 63 and the output module 64. The detector 63 detects a change in the orientation of the fastener 11 based on information from the wireless device 1. The output module 64 is configured to output information related to the change detected by the detector 63 to the display screen 65.

According to such a configuration, when a change in the orientation of a certain fastener 11 has developed among multiple fasteners 11, the fastener 11 in which a change in the orientation has developed may be easily identified based on information from the wireless device 1. It this becomes unnecessary to perform inspection of all fasteners 11. Alternatively, the frequency at which the inspection of all fasteners 11 is performed may be reduced.

Further, in the present embodiment, the detector 63 of the detection system 2 determines a state of the fastener 11 (e.g., the degree of deterioration of the fastener 11) based on information from the wireless device 1 (e.g., the gyro 21c). According to such a configuration, fasteners 11 having a relatively large degree of deterioration may be identified, and individual inspections may be performed, without performing inspection of all fasteners 11. The burden of inspections may thus be reduced.

Further, the detector 63 of the detection system 2 determines a state of the fixation object 100 to which multiple fasteners 11 are mounted (e.g., the degree of deterioration of the fixation object 100) based on information from the output of the sensors 21 of multiple wireless devices 11. According to such a configuration, the state of the fixation object 100 may be understood based on information sent wirelessly from multiple wireless devices 1. The frequency of inspections of the fixation object 100 may be reduced, for example, and the burden of inspections may be lightened.

Several modification examples of the first embodiment are described next. It is also possible to apply each of the modification examples explained below to a second embodiment described below.

Figure 7:
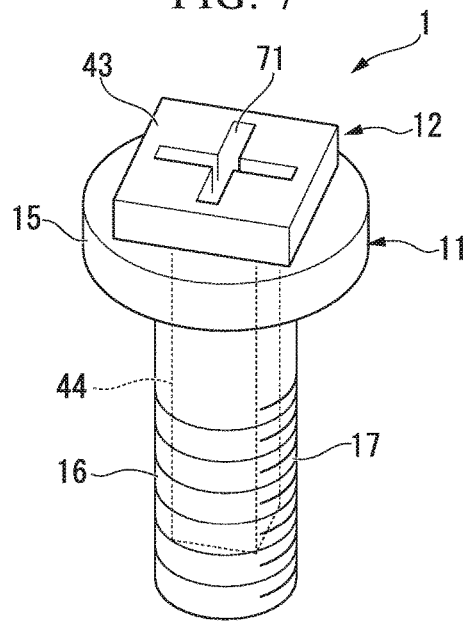
FIG. 7 is a perspective view of a fastener including a wireless device according to a first modification example.

FIG. 7 is a perspective view of the wireless device 1 according to a first modification example. As illustrated in FIG. 7, in the present modification example, the housing 43 of the sensor unit 12 includes a groove 71 into which the tip of a tool like a screw driver is capable of being inserted. The groove 71 may be a flat blade groove or a cross slot groove. According to such a configuration, work to mount the wireless device 1 to the fixation object 100 may be easily performed. Further, according to such a configuration, the sensor unit 12 may be easily mounted in a variety of fasteners 11, not only bolts.

Figure 8:
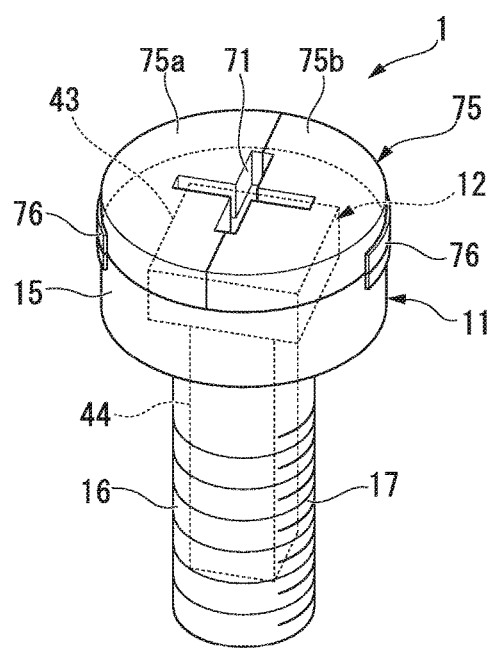
FIG. 8 is a perspective view of a fastener including a wireless device according to a second modification example.

FIG. 8 is a perspective view of the wireless device 1 according to a second modification example. As illustrated in FIG. 8, in the present modification example, a lid 75 is mounted to the head 15 of the fastener 11. The lid 75 covers the sensor unit 12 from a side opposite to the thread body 16. The lid 75 includes, for example, a first member 75a and a second member 75b. The first member 75a and the second member 75b are each capable of being opened and closed with respect to the head 15 of the fastener 11 by way of, for example, a hinge 76. By opening the first member 75a and the second member 75b with respect to the head 15, it becomes possible to remove the sensor unit 12 from the fastener 11. The groove 71, into which the tip of a tool like a screw driver is capable of being inserted, is formed in the lid 75. The groove 71 may be a flat blade groove or a cross slot groove. According to such a configuration, work to mount the wireless device 1 to the fixation object 100 may be easily performed, similar to the first modified example. Further, according to such a configuration, the sensor unit 12 may be easily mounted in a variety of fasteners 11, not only bolts.

Figure 9:
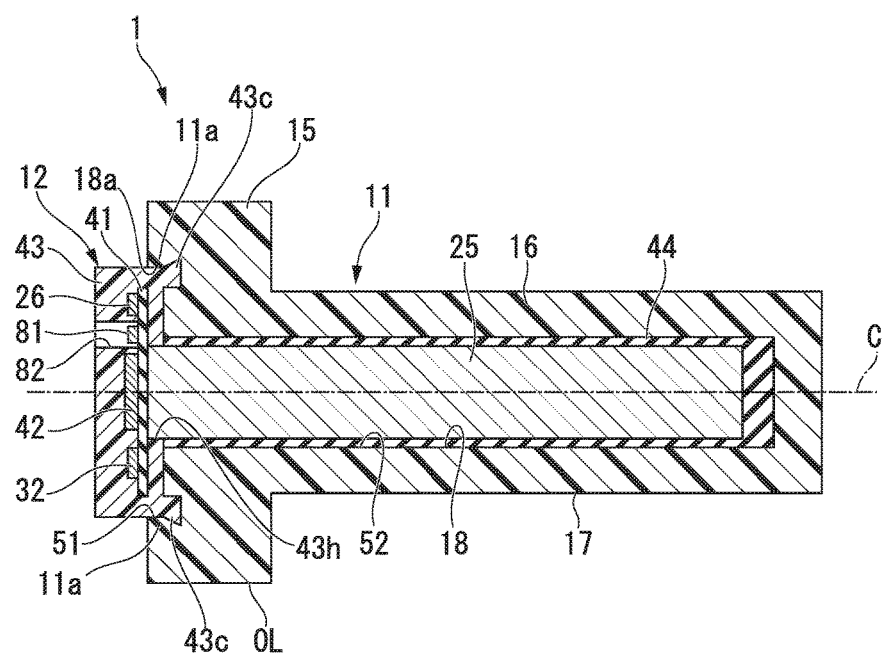
FIG. 9 is a perspective view of a fastener including a wireless device according to a third modification example.

FIG. 9 is a cross-section of the wireless device 1 according to a third modification example. As illustrated in FIG. 9, the fastener 11 of the present modification example is made from synthetic resin. Processing is relatively easy when the fastener 11 is made from synthetic resin, and a complex shape fastener 11 may thus be employed. Further, when made from synthetic resin, the fastener does not oxidize like metal, and therefore it is possible to use the fastener 11 for a long period of time in often wet environments, high humidity environments, and environments exposed to wind and rain. In addition, when made from synthetic resin, the fastener 11 is lighter compared to a fastener made of metal. The weight of the fixation object 100 may thus be decreased. Further, when made from synthetic resin, the fastener 11 may also be applied to locations where radio disturbances and other defects occurs when a fastener made from metal is employed.

On the other hand, deterioration advances due to ultraviolet light for a fastener made from synthetic resin.

The sensor 21 of the present modification example includes an ultraviolet light sensor 81. The housing 81 includes a window 82 that exposes the ultraviolet light sensor 81 to the outside of the housing 43. The window 82 allows ultraviolet light included in sunlight to be incident to the ultraviolet light sensor 81. The ultraviolet light sensor 81 measures the intensity of ultraviolet light bathing the fastener 11. The ultraviolet sensor 81 outputs ultraviolet light measurement results to the detector 22. The detector 22 determines the degree of deterioration of the fastener 11 due to ultraviolet light by comparing the value based on the output of the ultraviolet sensor 81 with standard values stored in the memory 23 corresponding to the ultraviolet sensor 81. The wireless circuit 31 transmits the degree of deterioration of the fastener 11 due to ultraviolet light estimated by the detector 22 to the external apparatus 28.

Further, instead of the above description, information relating to the amount of ultraviolet light received by each wireless device 1 in similar installations, and actual states of the fasteners 11 in each of the wireless devices 1 (e.g., degrees of deterioration of the fasteners 11) may be stored in the comparison information DB 62 of the detection system 2 of the present modified example. The detector 63 of the detection system 2 may also determine the state of the fastener 11 (e.g., the degree of deterioration of the fastener 11) based on a value obtained from (i.e., included in or generated from) output of the ultraviolet sensor 81 from the wireless device 1, and information in the comparison information DB 62.

According to the above configuration, deterioration of the synthetic resin made fastener 11 may be estimated well, with high accuracy. The detection accuracy of the wireless device 1 may thus be increased.

Second Embodiment

The wireless device 1 of a second embodiment is described with reference to FIG. 10 and FIG. 11. Differing from the first embodiment described above, the wireless device 1 of the present embodiment is capable of being detachably attached to a general purpose fastener (i.e., a general fastener on the market) 11. The other configurations of the wireless device 1 according to the second embodiment are similar to those of the first embodiment described above. Further, the detection system 2 utilizing the wireless device 1 of the present embodiment is similar to the detector system 2 of the first embodiment described above.

Figure 10:
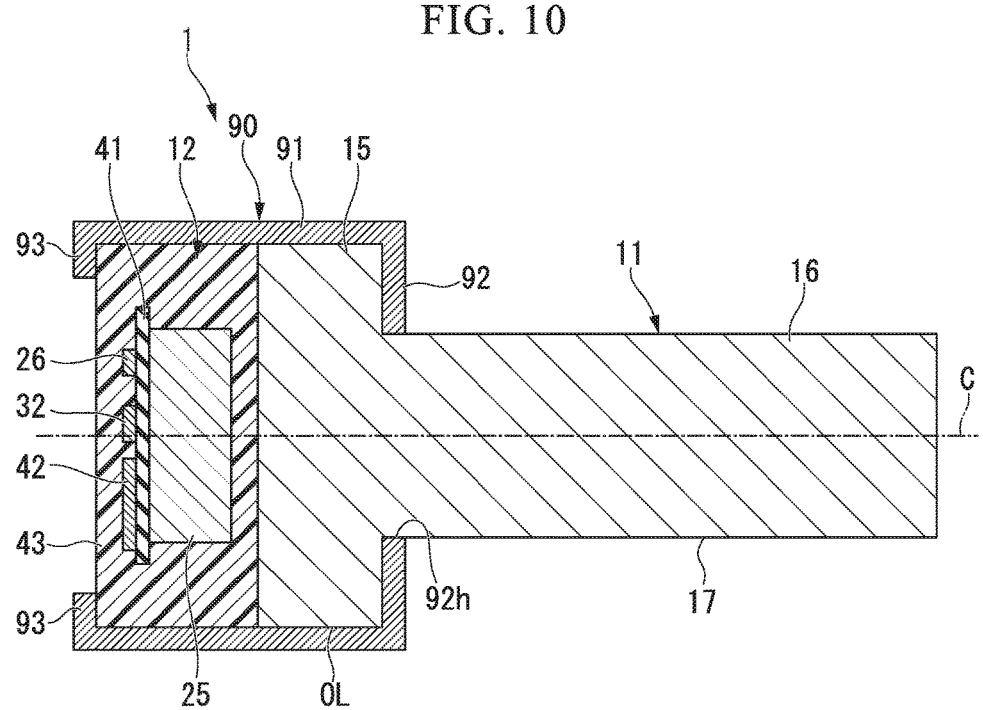
FIG. 10 is a cross-sectional diagram of a fastener including a wireless device according to a second embodiment.

FIG. 10 illustrates a cross-section of the wireless device 1 according to the present embodiment. As illustrated in FIG. 10, the wireless device 1 of the present embodiment is mounted to, for example, a general purpose bolt (e.g., a general purpose hex head bolt). The wireless device 1 includes the sensor unit 12, and a mounting member (attachment member) 90 capable of detachably attaching the sensor unit 12 to the fastener 11.

The sensor unit 12 of the present embodiment is formed in a polygonal shape (e.g., a hexagonal shape) substantially the same as the head 15 of the fastener 11. The sensor unit 12 overlaps the head 15 of the fastener 11 in a direction along the center axis C of the fastener 11.

In the present embodiment, the battery 25 is accommodated in the housing 43. The battery 25 has a flat cylindrical shape, and has an external shape smaller than the circuit board 41, for example. The battery 25 overlaps the circuit board 41 on a side opposite the chip component 42 and the like.

In the present embodiment, the antenna 32 is disposed nearer to the center axis C of the fastener 11 than the chip component 42 and the electric power supply component 26. At least a part of the antenna 32 is disposed in a location overlapping the center axis C of the fastener 11 when seen in a direction along the center axis C of the fastener 11. According to such a configuration, the antenna 32 may be separated from the mounting member 90 made from metal and described below. The communication properties of the antenna may thus be reliably maintained.

The mounting member 90 is, for example, a metallic cap used for fixing. The mounting member 90 has a first portion 91, a second portion 92, and a third portion 93.

Figure 11:
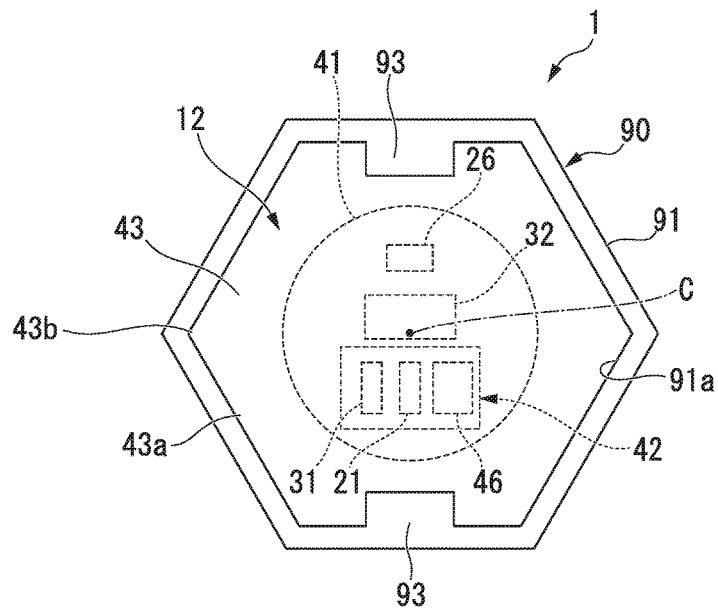
FIG. 11 is a plan view of the fastener including the wireless device according to the second embodiment.

FIG. 11 illustrates a planar diagram of the wireless device 1 according to the present embodiment. As illustrated in FIG. 10 and FIG. 11, the first portion 91 of the mounting member 90 is a portion that covers the head 15 of the fastener 11 and a side surface of the sensor unit 12. The first portion 91 of the mounting member 90 is formed in a polygonal (e.g., a hexagonal) cylindrical shape following an outer shape of the head 15 of the fastener 11 and an outside shape of the sensor unit 12. The first portion 91 of the mounting member 90 rotates along with rotation of the fastener 11. The first portion 91 of the mounting member 90 thus causes the sensor unit 12 to rotate corresponding to rotation of the fastener 11. Further, the first portion 91 of the mounting member 90 includes an opening portion 91a that passes through to the sensor unit 12 toward inside of the mounting member 90. The sensor unit 12 is accommodated inside the mounting member 90 by being inserted into the opening portion 91a.

As illustrated in FIG. 10, the second portion 92 of the mounting portion 90 faces the head 15 of the fastener 11 from a side opposite to that of the sensor unit 12. In other words, the second portion 92 of the mounting member 90 sandwiches and holds the fastener 11 between the second portion 92 and the sensor unit 12. The fastener 11 thus cannot come out from the mounting member 90. The second portion 92 of the mounting member 90 includes a through hole 92h that passes through to the thread body 16 of the fastener 11. The thread body 16 of the fastener 11 passes through the through hole 92h, protruding out to the outside of the mounting member 90.

The third portion 93 of the mounting member 90 is a claw for fixing the sensor unit 12. As illustrated in FIG. 11, the third portion 93 is provided in a part of a peripheral end of the first portion 91. As illustrated in FIG. 10, the third portion 93 of the mounting member 90 faces a peripheral portion of the sensor unit 12 from a side opposite to that of the head 15 of the fastener 11, and supports the sensor unit 12. In other words, the head 15 of the fastener 11 and the sensor unit 12 are sandwiched and supported between the second portion 92 and the third portion 93 of the mounting member 90. The sensor unit 12 thus should not be disengaged from the mounting member 90.

A method of mounting the mounting member 90 and the sensor unit 12 to the fastener 11 is as described below. First, the fastener 11 is inserted into the inside of the mounting member 90, and the thread body 16 of the fastener 11 is passed through the through hole 92h of the mounting member 90. Next, the sensor unit 12 is inserted into the inside of the mounting member 90. That is, the sensor unit 12 is inserted between the head 15 of the fastener 11 and the third portion 93. The fastener 11 and the sensor 12 are thus mounted to the mounting member 90. On the other hand, by performing the procedures described above in reverse order, the sensor unit 12 and the mounting member 90 can be dismounted from the fastener 11.

According to such a configuration, the burden of inspections of the fastener 11 may be lightened, similar to the first embodiment described above.

Further, in the present embodiment, the wireless device 1 includes the mounting member 90. The mounting member 90 is configured to detachably attach the sensor 21, the wireless circuit 31, and the antenna 32 to the fastener 11. According to such a configuration, the wireless device 1 can be coupled to a general purpose fastener 11. A wireless device 1 having a very high convenience may thus be provided.

The first embodiment, the second embodiment, and modification examples thereof, are described above. However, configurations are not limited to the ones described above. For example, the sensor unit 12 may also have a metal portion, and may also be coupled to the fastener 11 by welding or the like.

Further, the fastener 11, on which the sensor unit 12 is mounted, is not limited to being fixed using a bolt or screw. The fastener 11 to which the sensor unit 12 is coupled may be a nut. By using this kind of configuration, loosening of the nut or the like can be detected. Further, the fastener 11 on which the sensor unit 12 is coupled may also be a fastener component not having a screw portion, for example, such as a fastener like a rivet. In this kind of case as well, the burden of inspecting the fasteners may be reduced by detecting and transmitting the state of the fastener 11 using the sensor unit 12.

Further, processors that process information (the detection portion 22 of the sensor unit 12 of the wireless device 1, the detector 63 and the output module 64 of the detection system 2, and the like) may also be implemented by a processor such as a CPU or the like running a program. The program may be stored in the memory 23 in the MCU 46, or in memory included in the detection system 2. The processors described above may also be implemented by hardware such as an LSI (large scale integration) or an ASIC (application specific integrated circuit) including functions similar to a program run by a processor. The processors described above may also be implemented by a combination of hardware and a processor such as a CPU or the like running a program.

In accordance with at least one embodiment described above, a wireless device of an embodiment includes a sensor, an antenna, and a wireless circuit. The sensor is coupled with a fastener and configured to generate an output based on a change in the orientation of a fastener. The wireless circuit is configured to transmit at least one of the output and a signal which is generated based on the output outside the wireless device through the antenna. According to such a configuration, the burden of inspecting the fastener may be lightened.

While certain embodiments have been described, these embodiments have been presented by way of example only, and are not intended to limit the scope of the inventions. Indeed, the novel embodiments described herein may be embodied in a variety of other forms: furthermore various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A fastener having threads, comprising:
   a main body including a head portion and a thread portion having the threads;
   a sensor mounted on the main body and configured to generate a signal corresponding to a current state of the fastener;
   a nonvolatile semiconductor memory in which a reference value relating to a standard state of the fastener is stored;
   a detection circuit configured to determine a degree of deterioration of the fastener based on differences between the current state and the standard state; and
   a wireless module mounted on the main body and configured to transmit data indicating the degree of deterioration through a wireless signal.

2. The fastener according to claim 1, wherein the sensor includes at least one of an acceleration sensor and a geomagnetic sensor.

3. The fastener according to claim 2, wherein the sensor further includes a vibration sensor.

4. The fastener according to claim 1, wherein the detection circuit is configured to determine a rotational position of the fastener based on the signal.

5. The fastener according to claim 1, further comprising:
   a battery module mounted on the main body and configured to supply power to the wireless module.

6. The fastener according to claim 5, wherein
   the sensor, the wireless module, and the battery are formed as a package, and the package is mounted on the main body.

7. The fastener according to claim 6, wherein
   the main body includes an inner space formed through the head portion into an interior part of the thread portion, and the battery is disposed in the inner space.

8. The fastener according to claim 7, wherein
   the sensor and the wireless module are disposed on a substrate, and
   the battery faces a side of the substrate opposite to the side on which the sensor and the wireless module are disposed.

9. The fastener according to claim 6, wherein
   the package includes a resin enclosure in which the sensor, the wireless module, and the battery are enclosed.

10. The fastener according to claim 9, wherein
    the resin enclosure includes an engaging portion engaged with an engaging portion of the main body.

11. The fastener according to claim 9, wherein
    a cross-sectional peripheral shape of the resin enclosure in a direction perpendicular to a center axis of the fastener is a polygonal shape.

12. The fastener according to claim 1, wherein
    the sensor is formed in a chip, and a center axis of the fastener passes through the chip.

13. The fastener according to claim 1, wherein
    the reference value is a value that is obtained from a signal previously generated by the sensor.

14. The fastener according to claim 1, wherein
    the wireless module is configured to periodically transmit the data indicating the degree of deterioration.

15. A wireless device attachable to a head of a fastener having threads, comprising:
    an enclosure;
    a sensor within the enclosure and configured to generate a signal corresponding to a current state of the fastener when the wireless device is attached to the fastener;
    a nonvolatile semiconductor memory that is disposed in the enclosure and in which a reference value relating to a standard state of the fastener is stored;
    a detection circuit configured to determine a degree of deterioration of the fastener based on differences between the current state and the standard state; and
    a wireless module within the enclosure and configured to transmit data indicating the degree of deterioration through a wireless signal.

16. The wireless device according to claim 15, further comprising:
an attachment member having an engaging portion that is engageable with the head of the fastener.

17. The wireless device according to claim 15, wherein the sensor includes at least one of an acceleration sensor and a geomagnetic sensor.

18. The wireless device according to claim 17, wherein the detection circuit is configured to determine a rotational position of the fastener based on the signal.

19. The wireless device according to claim 17, further comprising:
a battery module within the enclosure and configured to supply power to the wireless module.

20. A system for presenting data indicating a degree of deterioration of a fastener used in a structure, comprising:
a fastener including a main body including a head portion and a thread portion having the threads, a sensor coupled to the main body and configured to generate a signal corresponding to a current state of the fastener, a nonvolatile semiconductor memory that is coupled to the main body and in which a reference value relating to a standard state is stored, a detection circuit coupled to determine the degree of deterioration of the fastener based on differences between the current state and the standard state, and a wireless module coupled to the main body and configured to transmit data indicating the degree of deterioration through a wireless signal; and;
a detection center that receives the data transmitted through the wireless signal over a network, and displays the data on a display.

* * * * *